United States Patent
Hsia et al.

(10) Patent No.: US 7,629,247 B2
(45) Date of Patent: Dec. 8, 2009

(54) METHOD OF FABRICATING A SELF-ALIGNING DAMASCENE MEMORY STRUCTURE

(75) Inventors: Kang-Jay Hsia, Pleasanton, CA (US); Calvin Li, Fremont, CA (US); Christopher Petti, Mountain View, CA (US)

(73) Assignee: Sandisk 3D LLC, Milpitas, CA (US)

( * ) Notice: Subject to any disclaimer, the term of this patent is extended or adjusted under 35 U.S.C. 154(b) by 24 days.

(21) Appl. No.: 11/786,620

(22) Filed: Apr. 12, 2007

(65) Prior Publication Data

US 2008/0254576 A1   Oct. 16, 2008

(51) Int. Cl.
*H01L 21/4763* (2006.01)
(52) U.S. Cl. .............. 438/621; 438/197; 438/700; 257/E21.17; 257/E21.051; 257/E21.227; 257/E21.229; 257/E21.304; 257/E21.315; 257/E21.267
(58) Field of Classification Search .......... 438/197, 438/692, 680, 706, 745, 786, 787, 791, 700, 438/621
See application file for complete search history.

(56) References Cited

U.S. PATENT DOCUMENTS

| 6,034,882 A | 3/2000 | Johnson et al. |
| 6,420,215 B1 | 7/2002 | Knall et al. |
| 6,525,953 B1 | 2/2003 | Johnson et al. |
| 6,717,222 B2* | 4/2004 | Zhang .................. 257/390 |
| 6,952,043 B2 | 10/2005 | Yyvoda et al.. |
| 2006/0189077 A1 | 8/2006 | Herner et al. |
| 2006/0273298 A1* | 12/2006 | Petti ........................ 257/5 |
| 2008/0017890 A1* | 1/2008 | Yuan et al. ............. 257/213 |

FOREIGN PATENT DOCUMENTS

| KR | 10-2000-00606 67 | 10/2000 |
| KR | 10-2001-00084 47 | 2/2001 |
| KR | 10-2005-00669 63 | 6/2005 |

OTHER PUBLICATIONS

International Search Report and Written Opinion of International Application No. PCT/US2008/004665 (SD-MXA244-PCT) mailed Jun. 25, 2008.

* cited by examiner

*Primary Examiner*—David Nhu
(74) *Attorney, Agent, or Firm*—Dugan & Dugan, PC

(57) ABSTRACT

A method of forming a three-dimensional, non-volatile memory array utilizing damascene fabrication techniques is disclosed. A bottom set of conductors is formed and a set of first pillar shaped elements of heavily doped semiconductor material as formed thereon. A mold is formed of insulating material having pillar shaped openings self-aligned with the first pillar shaped elements and a second semiconductor is deposited over the mold to form second pillar shaped elements aligned with the first pillar shaped elements. The pillar elements formed may be further processed by forming another mold of insulating material having trench openings aligned with the pillar shaped elements and then filling the trenches with conductive material to form conductors coupled to the pillar shaped elements.

26 Claims, 13 Drawing Sheets

METHOD OF FABRICATING A SELF-ALIGNING DAMASCENE MEMORY STRUCTURE

BACKGROUND

The field of the invention relates to memory devices and more particularly to non-volatile semiconductor memories.

The use of memory has been increasing due to rapid growth of storage needs in the information and entertainment fields and due to the decreasing size and cost of memory. One type of memory widely used is non-volatile semiconductor memory which retains its stored information even when power is removed. There are a wide variety of non-volatile memories. A typical commercial form of non-volatile memory utilizes one or more arrays of transistor cells, each cell capable of non-volatile storage of one or more bits of data.

Unlike random access memory (RAM), which is also solid-state memory, non-volatile memory retains its stored data even after power is removed. The ability to retain data without a constant source of power makes non-volatile memory well adapted for consumer devices. Such memories are well adapted to small, portable devices because they are typically relatively small, have low power consumption, high speed and are relatively immune to the operating environment.

In general, the small size, low power consumption, high speed and immunity to environment is derived from the structure of the memory. In this regard, such non-volatile memory devices are typically fabricated on silicon substrates. In addition, to obtain the advantages of small size, etc., and well as reduce costs, there is a continual effort to fabricate more circuitry within a given area.

For nonvolatile memory, a highly effective approach to increase density is to build monolithic three dimensional memories above the substrate, like those disclosed in Johnson et al., U.S. Pat. No. 6,034,882; Johnson et al. U.S. Pat. No. 6,525,953; Knall et al., U.S. Pat. No. 6,420,215; and Vyvoda et al., U.S. Pat. No. 6952043, all hereby incorporated by reference in their entirety.

The fabrication of these high density, three dimensional memory arrays presents a number of challenges. This includes misalignment of features during fabrication which results in reduced yield and which becomes more problematic as feature size is reduced. For example, where the photomask is improperly placed, the memory element may be short circuited during subsequent fabrication operations, or necessary electrical connections may fail to be made. Thus, alternate methods of fabrication are needed that reduce the difficulties of aligning memory elements during fabrication while permitting improved density, decreased future size, and improved yield.

SUMMARY

The present invention is defined by the following claims, and nothing in this section should be taken as a limitation on those claims.

In one embodiment, a method is provided for forming a structure for a memory cell comprising forming a first pillar-shaped element of heavily doped semiconductor material. A mold of a first type of insulating material is formed having an opening self aligned with the first pillar-shaped element and a second semiconductor material is then deposited over the mold to form a second pillar shaped element disposed on and aligned with the first pillar shaped element.

In another embodiment, a method is provided for fabricating a memory cell comprising forming a pillar-shaped semiconductor element having a heavily doped first semiconductor layer and a second semiconductor layer on and aligned with the first layer. The method further comprises forming a mold of a first insulating material having a trench opening substantially aligned with the pillar-shaped semiconductor element, and doping a portion of the second semiconductor layer to form a third semiconductor layer. The trench is then filled with conductive material, and optionally an anti-fuse may be formed over the third semiconductor layer and a reaction barrier may be deposited over the anti-fuse before filling the trench with conductor material.

BRIEF DESCRIPTION OF DRAWINGS

The features of the present invention,.which are believed to be novel, are set forth with particularity in the appended claims. The invention, together with further advantages, may best be understood by reference to the following description taken in conjunction with the accompanying drawings. In the figures, like reference numerals identify like elements.

DETAILED DESCRIPTION

Figure 1:
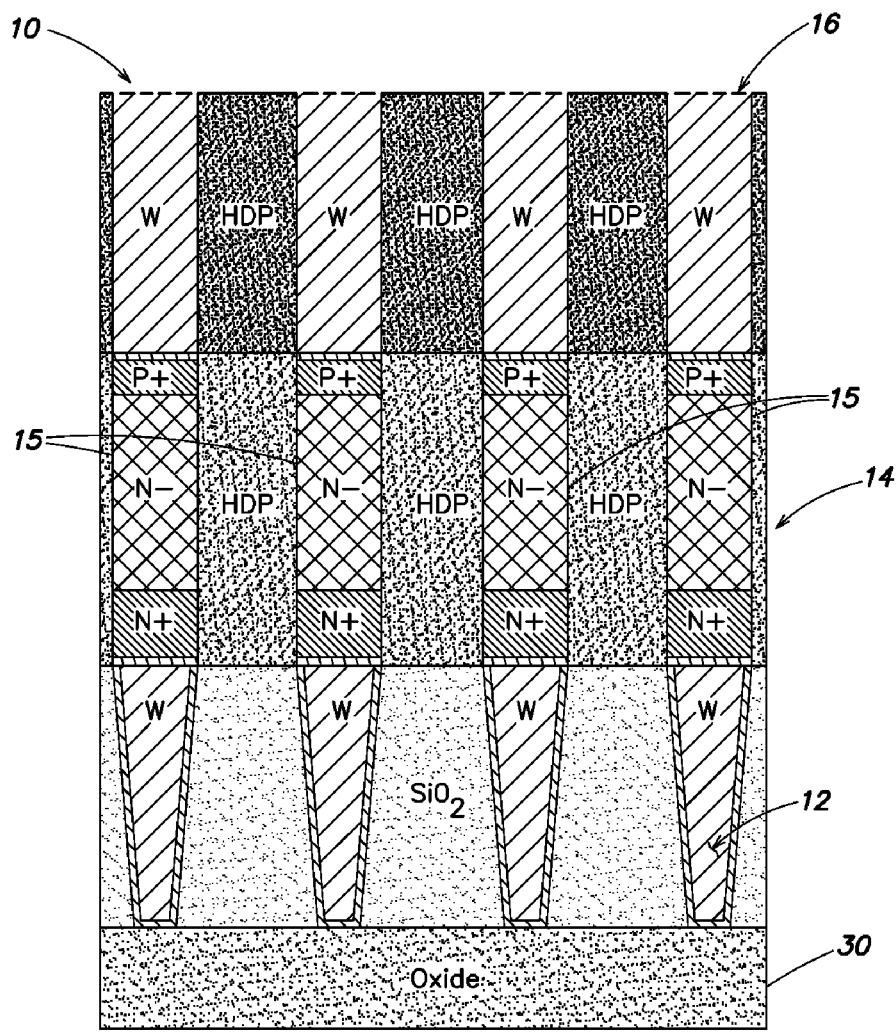
FIG. 1 is a cross-sectional view illustrating one embodiment of a monolithic three dimensional memory array.

While the present invention is susceptible of embodiments in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated. In this disclosure, the use of the disjunctive is intended to include the conjunctive. The use of the definite article or indefinite article is not intended to indicate cardinality. In particular, a reference to "the" object or "an" object is intended to denote also one or a possible plurality of such objects.

FIG. 1 depicts one embodiment of a monolithic three dimensional memory array 10 which includes a first set of conductors 12, an array of memory cells 14 composed of individual memory elements or cells 15 and a second set of conductors 16. The array 10 is fabricated above the surface of a substrate. It should be noted that, for simplicity, the first set of conductors 12 and second set of conductors 16 are shown as being parallel. However in actual construction, the first set of conductors 12 and second set of conductors 16 would be perpendicular, as shown generally in U.S. Pat. Appl. No. US 2006/0189077 to Herner et al. (incorporated herein by reference). In some embodiments, supporting circuitry may also be created in the wafer 18 before creation of the monolithic three dimensional memory array 10 on the substrate 18. The process may begin with a set of steps that result in the creation of a set of CMOS transistors and other drive and selection circuitries, referred to as "the front end." The final step involves the creation of a routing layer. The routing layer may, for example, be formed by connecting the CMOS transistors below to the memory cells above.

Figure 2:
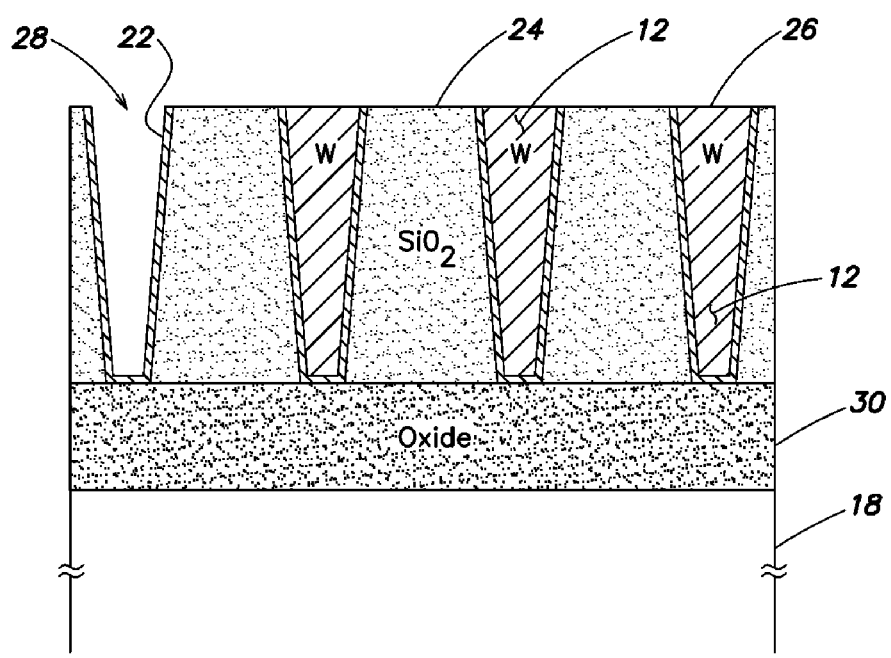
FIG. 2 is cross-sectional view illustrating one embodiment of fabrication of a set of conductors for the three dimensional memory array.

In one embodiment, fabrication of the memory array 10 may begin, as illustrated in FIG. 2, with formation of an insulating layer 30 over the substrate 18. The thickness of this layer 30 may vary over a wide range; however, in one embodiment it may be about 2000 Angstroms. The insulating layer 30 can be silicon dioxide, silicon nitride, a high-dielectric film, a Si—C—O—H film or any other suitable insulating material.

A first set of damascene conductive elements 12 may then be fabricated over the insulating layer 30. As used herein, a damascene conductor or conductive element 12 is a conductor formed by a damascene process. A damascene process for forming conductive lines is a process in which, for example, a material such as a dielectric 24 (e.g., as shown in the illustrated embodiment of FIG. 2, an oxide such as silicon dioxide) is deposited over the insulating layer 30 of the substrate 18, after which lines or slots 28 are etched in the dielectric 24, and then the slots or lines are filled with a conductive material 26 to create the conductors 12. The conductive material film on top of the original plane of dielectric 24 is removed by any suitable process, (e.g. chemical-mechanical planarization (CMP)), leaving isolated conductive material 26 as conductive elements 12 (i.e. conductors or wires), with the remaining dielectric material 24 insulating the conductors 12 from one another.

To form the conductive elements 12 illustrated in the embodiment of FIG. 2, the dielectric layer 24 may be blanket deposited over the insulating layer 30. The dielectric layer 24 may be any suitable electrically insulating material (e.g., silicon dioxide, silicon nitride, silicon oxynitride, etc.). In one embodiment, the dielectric layer 24 may be silicon dioxide, as shown, deposited by an appropriate method, such as chemical vapor deposition (CVD), high density plasma (HDP), etc.

The dielectric layer 24 may then be patterned and etched to form slots 28 for the conductors 12. For example, the layer 24 may be covered with a photoresist and exposed. The exposed (or unexposed) photoresist may be removed, and the dielectric layer 24 in the exposed (or unexposed) areas etched away to define the slots or lines 28.

A conductive material 26 may then be deposited in the slots 28. To help the conductive material 26 adhere to the oxide layer 24, an optional adhesion layer 22 may first be deposited in the slots 28. The adhesion layer 22, in some embodiments, may be TaN, WN, TiW, sputtered tungsten, TiN or combinations of these materials. If the conductive material 26 of the damascene conductive elements 12 is tungsten, TiN is preferred as the adhesion layer 22. In the case where an adhesion layer 22 is included, it can be deposited by any process known in the art. Where the adhesion layer is TN, a layer of TiN may be deposited or a layer of Ti may be deposited and followed by a nitridation process. In some other embodiments, an adhesion layer of TiN may be deposited by a CVD process, a physical vapor deposition (PVD) process such as sputtering, or an atomic layer deposition (ALD) process. In one embodiment, the TiN layer 22 may be deposited by sputtering to a depth of from 20 to about 500 angstroms.

The conductive material 26 may then be deposited over the adhesion layer 22 as illustrated in FIG. 2. The conducting material 26 may be formed from any of a number of conductive metals (e.g., tantalum, titanium, tungsten, cobalt, alloys thereof, etc.). Where the conductive material 26 is tungsten, it may, for example, be deposited by any suitable process, such as a CVD process or a PVD process. In one embodiment, the tungsten is deposited by a CVD process. The depth of the conductive elements 12 can depend upon the desired resistance limits of the conductive elements 12. In one embodiment, the depth may be in a range from about 200 to about 4000 angstroms and in another embodiment the thickness may be approximately 3000 angstroms. As used herein, thickness means vertical thickness measured in a direction perpendicular to the substrate. Width means the width of a line or feature in a plane parallel to the substrate.

Deposition of the adhesion layer 22 and conducting materials 26 within the slots 28 also results in an overcoating of the adhesion and conducting materials over the oxide 24 that separate the conductive elements 12. To remove the overcoat, the over-coated conducting material 26 and adhesion layer 22 over the oxide 24 may be planarized. This planarization may be performed using any suitable planarizing process such as CMP.

Figure 3A:
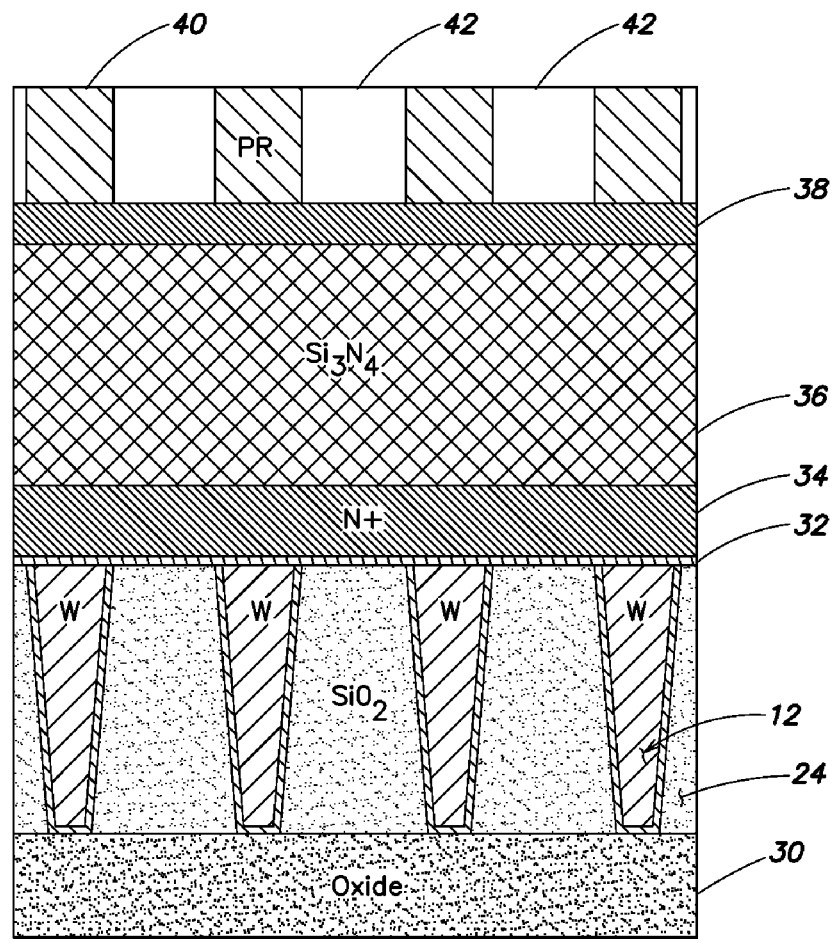
FIG. 3a is a cross-sectional view illustrating one embodiment of formation of a dielectric layer for fabrication of a memory array.

Individual memory cells 15 of the array of memory cells 14 of FIG. 1 may then be formed over the first set of conductors 12. The memory cells 15 in some embodiments may each include two portions of a diode, and an anti-fuse with an optional barrier layer. As illustrated in FIG. 3a, in one embodiment, a barrier layer 32 may be deposited over the planarized surface of the dielectric 24 and conductors 12. The barrier layer 32 functions to prevent unwanted interaction between the conductive material 26 forming the conductors 12 and semiconductor layers deposited over the conductors 12. The barrier layer 32 may be deposited as a blanket layer over the conductors 12 and dielectric 24. The barrier layer 32 may be any suitable barrier material such as WN, TaN, TiN, etc. and may be deposited in any of the manners discussed above with reference to the adhesion layer 22. In embodiments where the conductive material 26 is tungsten, the barrier layer 32 in one embodiment may be TiN. The thickness of the barrier layer may be any thickness that provides the barrier function. In one embodiment, the thickness may be about 20 to about 500 angstroms and in another embodiment, about 100 angstroms.

In the embodiment of FIG. 3a, a layer 34 of a heavily doped semiconductor of a first type (e.g., N– type or P– type silicon)

is deposited as shown. This layer 34 may form an ohmic contact with the barrier layer 32 to the conductor 12 of FIG. 1. The heavily doped layer 34 may be formed using any suitable deposition and doping methods. In one embodiment, the heavily doped semiconductor 34 may be N− silicon as shown, and the thickness may range from about 100 to over 2000 angstroms and preferably about 500 angstroms. This layer 34 in the illustrated embodiment of FIG. 3*a* may have a doping concentration of from about $1\times10^{19}$ to about $1\times10^{21}$ atoms/cm$^3$, and in one embodiment about $5\times10^{20}$ atoms/cm$^3$.

Over the heavily doped layer 34, a layer 36 of a sacrificial material such as a dielectric material (e.g., $Si_3N_4$) may be deposited in one embodiment via any known method. The sacrificial material may be any suitable material such as silicon oxide, silicon nitride, silicon oxynitrate, etc. As illustrated, in one embodiment, the sacrificial dielectric may be $Si_3N_4$ deposited to a thickness of about 3000 angstroms. The thickness of the sacrificial layer 36 is chosen based upon the desired thickness of the pillar structure to be fabricated. Prior to deposit of sacrificial material layer 36, a thin silicon oxide layer (e.g. 12-20 angstroms) may be allowed to form over the semiconductor layer 34. This native oxide layer provides beneficial protection of the semiconductor layer 34.

Figure 3B:
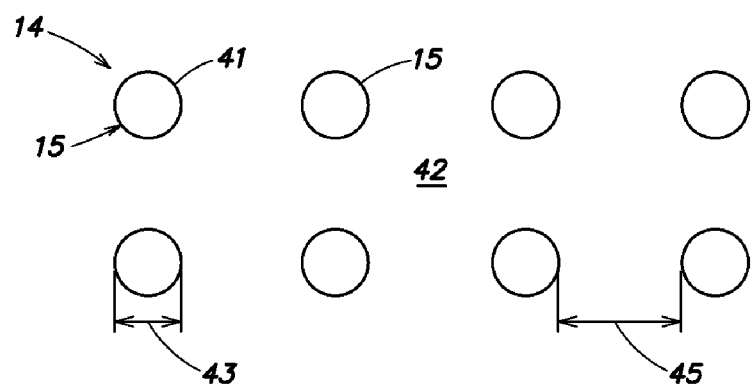
FIG. 3b is a diagram illustrating a top view of one embodiment of an array of pillar structures for the memory array.

Once the sacrificial layer 36 has been deposited, the wafer may be patterned and etched. To this end, in one embodiment a hard mask 38 (e.g., dark antireflective coating (DARC), bottom antireflective coating (BARC), or oxide layer) and a photoresist material 40 may be deposited over the sacrificial layer 36. In one embodiment the hard mask 38 may be about 320 angstroms thick and the photoresist about 1600 angstroms thick. The photoresist material 40 may be exposed through a photomask (not shown) to define a periphery 41 (see FIG. 3*b*) of the memory cells 15. FIG. 3*b* illustrates an example of an array 14 of pillar shaped memory cells 15 viewed from above. The memory cells may, in one embodiment, be arranged in a two-dimensional array of rows and columns as illustrated in the example of FIG. 3*b*. In exemplary embodiments, the diameter 43 of each memory cell 15 may be 45 nm-130 nm and the memory elements 15 may be separated by a distance 45 of 45 nm-130 nm. These dimensions may vary over a wide range and are limited by the lithography technology used.

Figure 4:
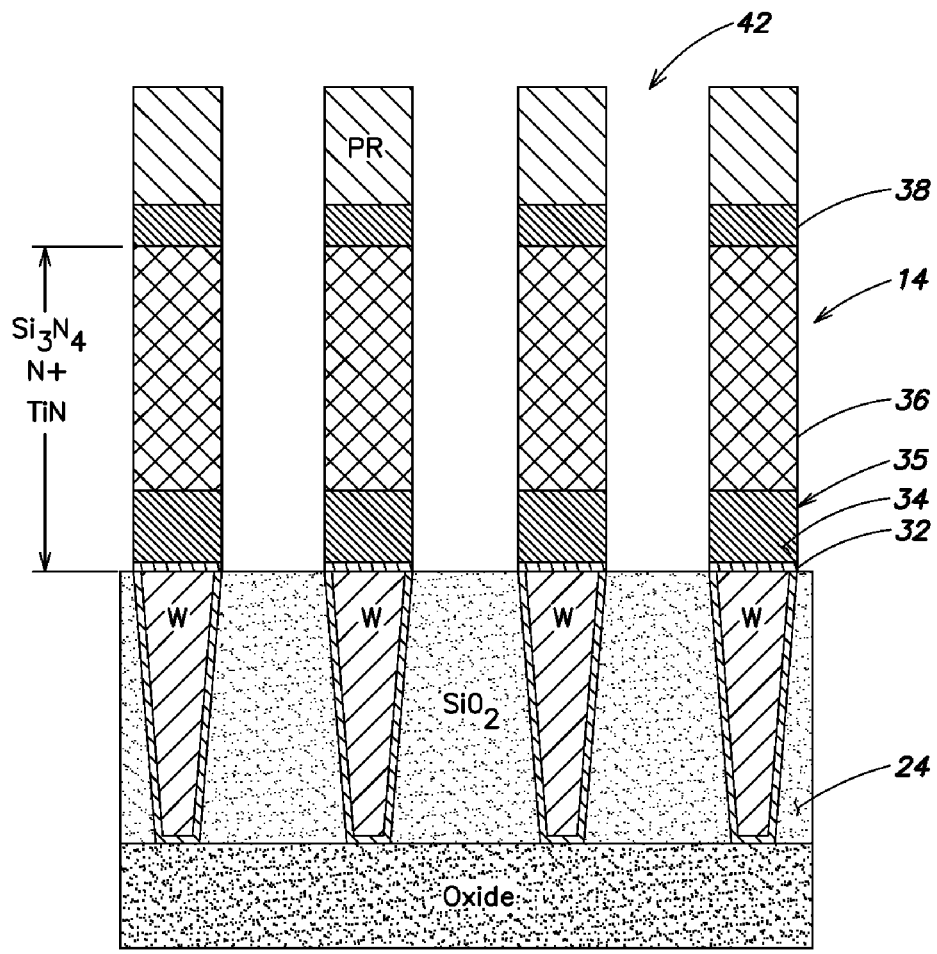
FIG. 4 is a cross-sectional view illustrating one embodiment of fabrication of dielectric pillars for fabrication of the memory array.

Following exposure of the photoresist 40, the area 42 outside the periphery 41 of each memory cell is removed via an appropriate process (e.g., a dry etch process). As shown in FIG. 4, an area 42 outside the periphery of the memory cells 14 is etched through the hard mask 38, the sacrificial layer 36, the layer of the semiconductor of the first type 34 and the barrier layer 32 to expose the insulator layer 24 at the bottom of the etch area 42. Following the etch step, the remaining photoresist 40 may be removed. A HF clean step may be used to remove any remaining photoresist and clean the surface of the oxide. This step results in an array of pillar shaped elements made up of pillar shaped semiconductor elements 35 capped by a pillar of the sacrificial material 36.

Figure 5:
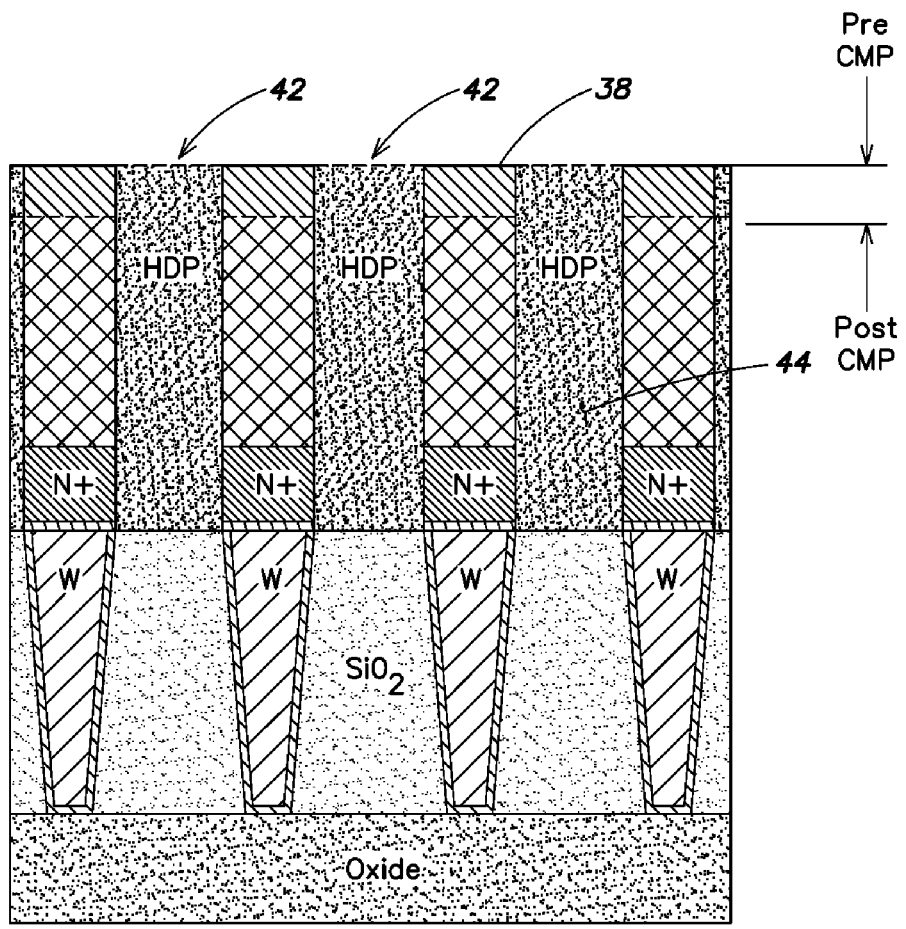
FIG. 5 is a cross-sectional view illustrating one embodiment of formation of a mold for fabrication of the memory array.

As illustrated in the embodiment of FIG. 5, following removal of the photoresist, the etched area 42 may be filled using any suitable insulating material 44 (e.g., silicon oxide, silicon oxynitride, etc.). Where the insulating material is silicon oxide, the silicon oxide may be deposited by an appropriate deposition process (e.g., CVD, high density plasma CVD (HDPCVD), etc.). Under one embodiment, the insulating material 44 may be a High Density Plasma Silicon Dioxide (HDP as shown in FIG. 5). Following the filling of the etched area, the surface may be planarized. Any appropriate technique (e.g., CMP) may be used to planarize the surface and to remove any remaining DARC. In the planarizing step, the hard mark 38 may be removed along with small portion of the sacrificial material 36 and oxide 44, as shown, to provide a planar surface.

Figure 6:
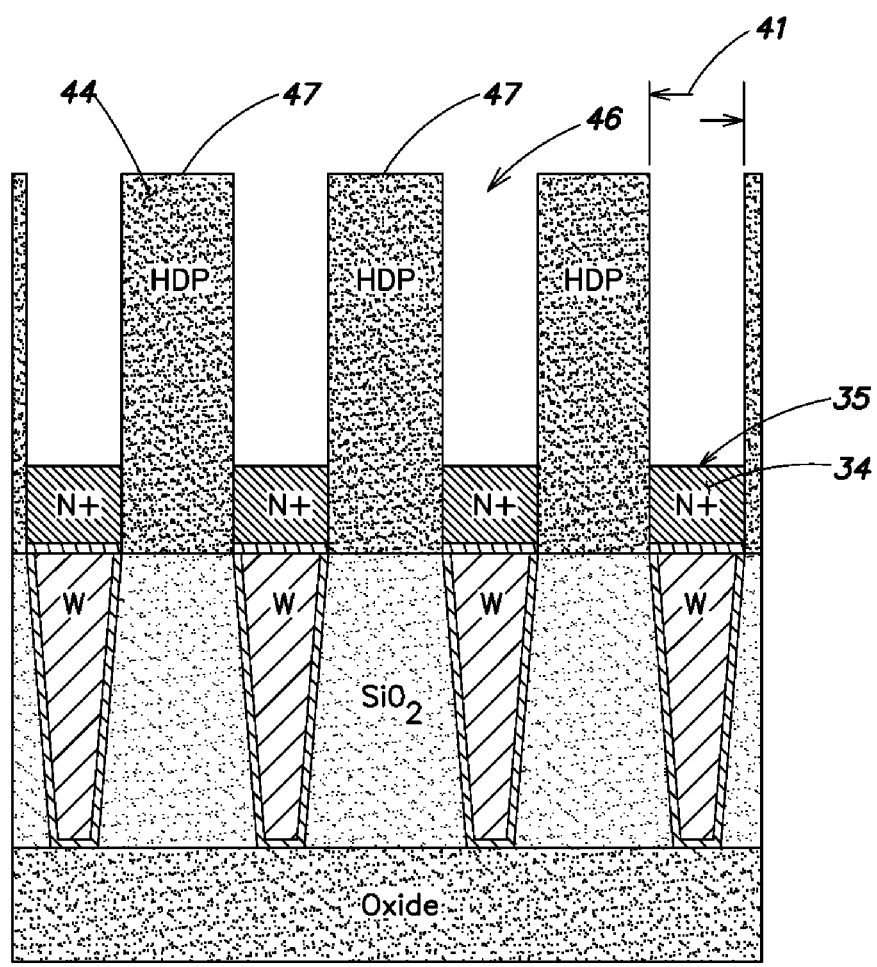
FIG. 6 is a cross-sectional view illustrating one embodiment of removal of dielectric pillars for formation of a dielectric mold.

Next, the sacrificial material 36 lying within the periphery 41 of each of the memory cells 15 is removed down to the surface of the heavily doped layer 34 of the semiconductor of the first type as illustrated by the example of FIG. 6. Etching may be accomplished by any etch process (e.g. a wet etch) compatible with the sacrificial material (e.g. Si3N4), and which has good selectivity between the sacrificial material and the insulating material 44 (e.g. HDP) and also the heavily doped silicon 34. Removal of the sacrificial material 36 within the periphery 41 of the memory cells 15 forms a mold 47 made up of the insulating material 44 as shown in the illustrated embodiment of FIG. 6. The open areas 46 within the periphery 41 of the mold 47 are self-aligned with the heavily doped semiconductor pillar structures 35 because the heavily doped semiconductor layer 34 and sacrificial layer 36 are patterned in a shared masking and etching step. This self alignment eliminates the spatial error that occurs when one layer is independently aligned to the layer below, and thereby allows smaller feature size and higher yield.

Figure 7:
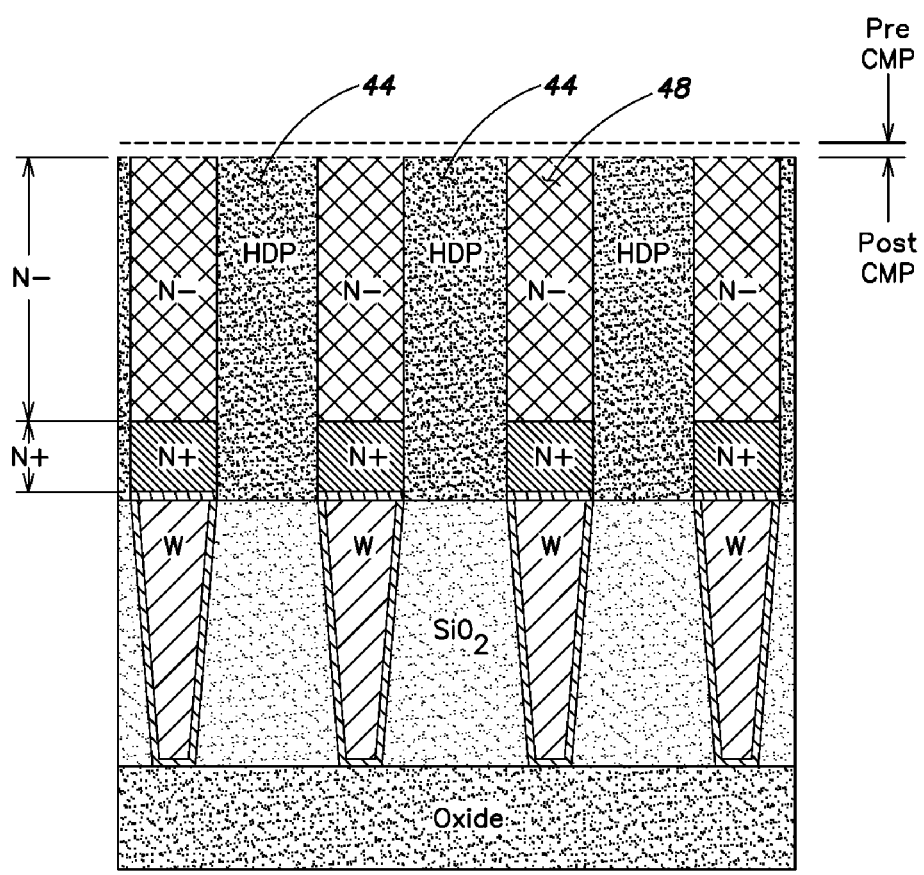
FIG. 7 is a cross-sectional view illustrating one embodiment of formation of a lightly doped pillar structure for the memory array.

The area 46 within the periphery 41 (i.e. within the mold 47) may next be backfilled with a semiconductor material 48 as illustrated in FIG. 7. An HF dip (e.g. 100:1 HF for 30 secs.) may be performed prior to the fill to remove any native oxide over the semiconductor 34 and the clean surface for the fill. In one embodiment where the heavily doped semiconductor 34 of the first type may be N+ silicon, then the semiconductor 48 is may, for example, be lightly doped N− silicon, as shown. The backfill semiconductor material 48 can be deposited by any suitable deposition and doping method and may be deposited as polycrystalline silicon. In the illustrated embodiment, the thickness of the semiconductor material 48 can range from about 500 to 5000 angstroms, but in one embodiment a thickness of about 2500 angstroms may be used. In one embodiment, the layer 48 can have a doping concentration from about $1\times10^{15}$ to about $1\times10^{18}$ atoms/cm$^3$. In another embodiment, silicon is deposited without intentional doping since defects will render the silicon effectively slightly doped N-type. The surface of semiconductor material 48 may be planarized to remove excess semiconductor material and provide smooth, planar surface. Planarization may be performed by any suitable technique such as CMP, and may be followed by a HF dip to clean the surface.

Figure 8:
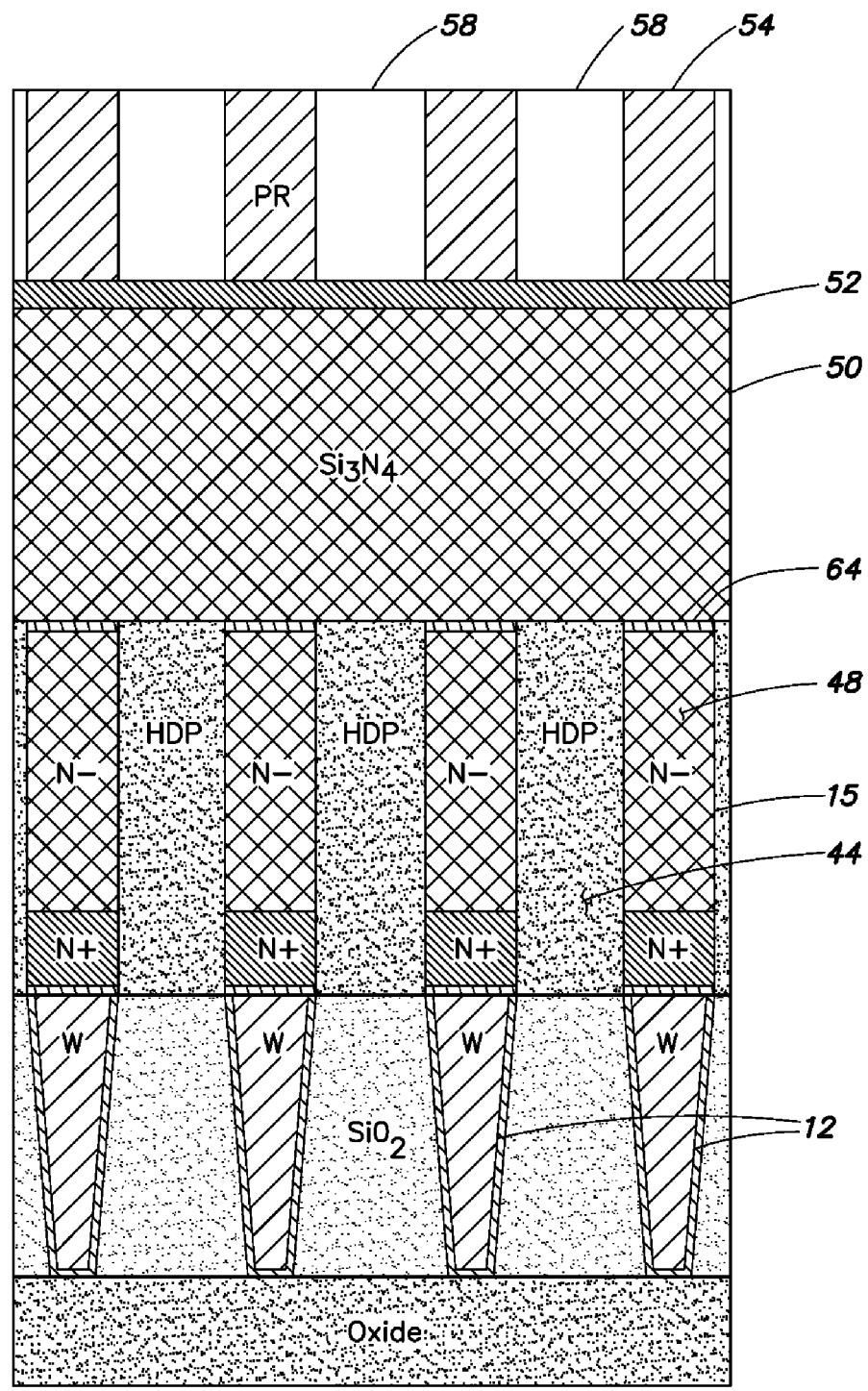
FIG. 8 is a cross-sectional view illustrating one embodiment of formation of a dielectric layer for the fabrication of the memory array.

Following planarization of the partially completed array another layer 50 of sacrificial material such as a dielectric material may be deposited over the lightly doped semiconductor 48 and insulating material 44 as shown in FIG. 8 using any known method of deposition. The sacrificial material may be any suitable material, and for example, as illustrated, may be silicon nitride. The sacrificial material layer 50 may be deposited over a native oxide layer 64 which may be allowed to grow over the lightly doped semiconductor 48. The thickness of the sacrificial 50 may be determined largely by a desired thickness of the next layer of conductor for the memory. In one embodiment the thickness is approximately 3000 angstroms. The sacrificial layer 50 may be covered with a hard mask 52 (e.g., DARC, BARC, etc.) as shown in FIG. 8 and by the photoresist layer 54.

Figure 9:
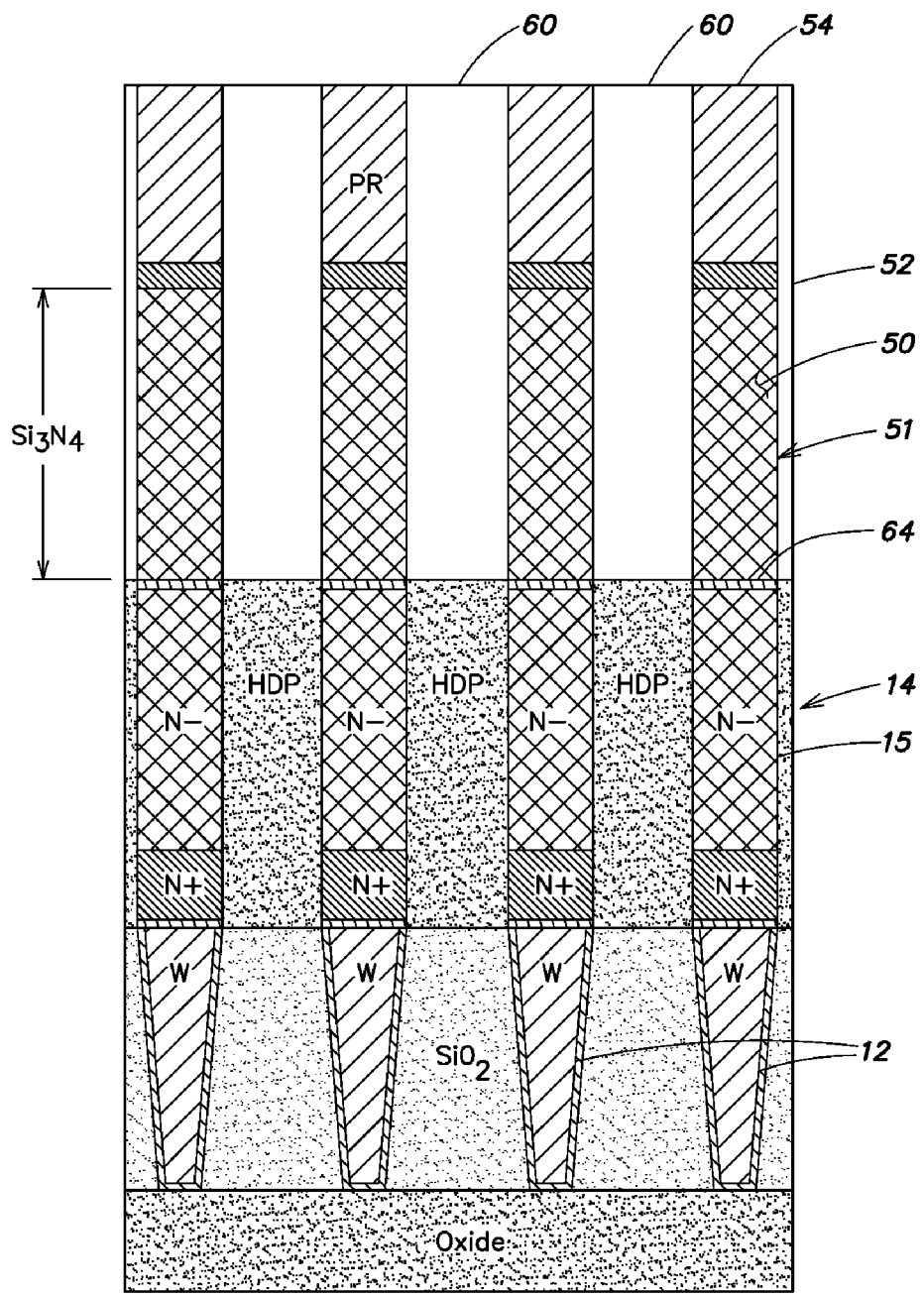
FIG. 9 is a cross-sectional view illustrating one embodiment of the formation of dielectric rails for fabrication of conductor lines for the memory array.

The photoresist layer 54 may then be exposed through a photomask (not shown) and developed to remove photoresist in regions 58. It should be noted that the Figures illustrate the lines 58 as if they are perpendicular to the page in order to illustrate that there are multiple parallel lines. However, in actual construction they would be parallel to the page and perpendicular to the conductors 12 at the bottom of the structure 10. After the photoresist layer 54 is patterned, an etch may be performed to remove the hard mask layer 52 and the sacrificial material 50 in the regions 58 where the photoresist 54 was removed, forming etched gaps 60 and rails of sacrificial material 51 as shown in FIG. 9. The etch may use any suitable process (e.g. a dry etch) for etching the hard mask 32 and the sacrificial material 50. After the etch, the photoresist 54 is stripped and the surface may be cleaned using, for example, an HF clean to remove any remaining photoresist.

Figure 10:
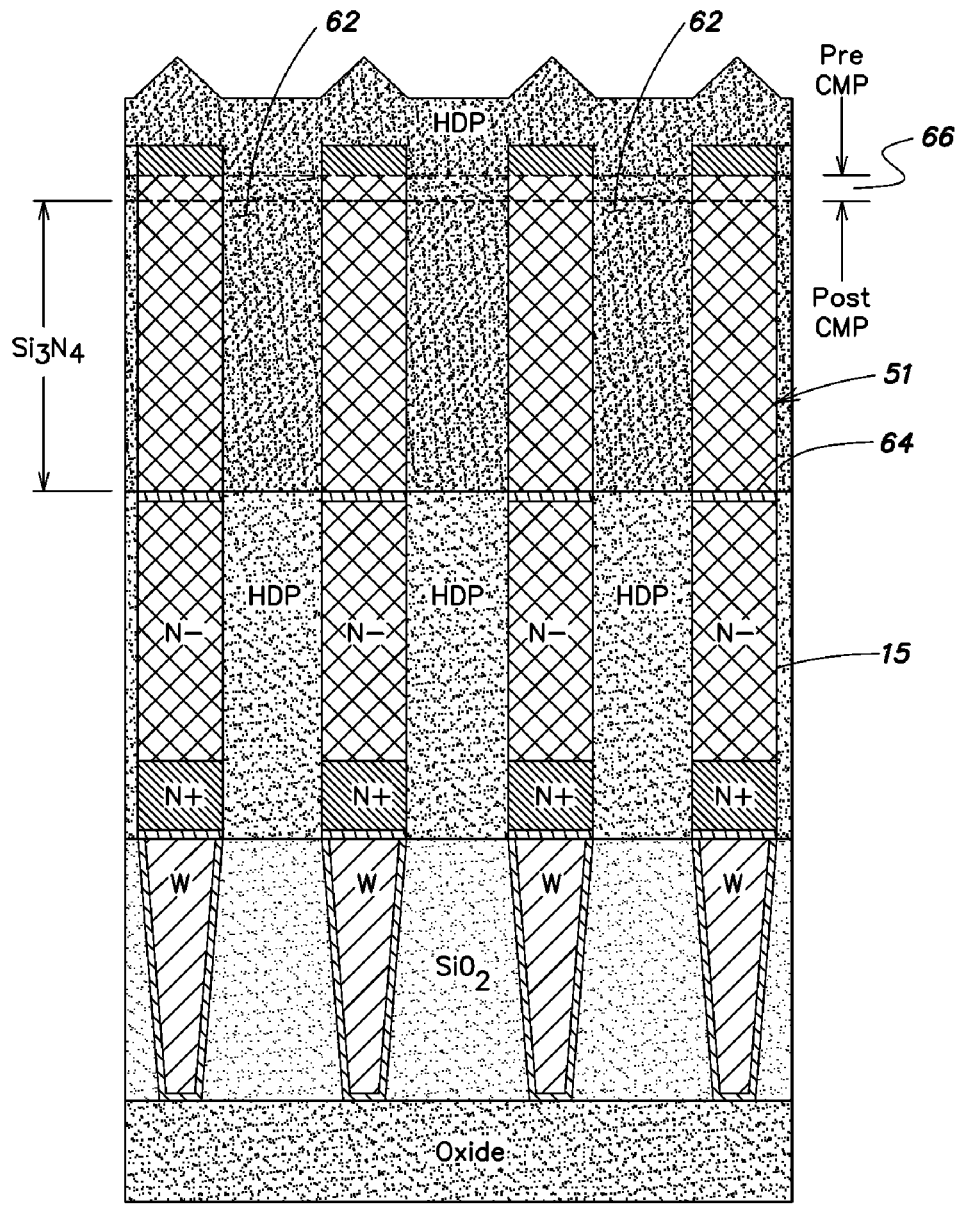
FIG. 10 is a cross-sectional view illustrating one embodiment of the deposition of insulating material over the dielectric rails for fabrication of conductors for the memory array.

After the photoresist 54 is removed, the etched gaps 60 between the rails 51 may be filled using any suitable insulating material 62 such as HDP oxide, as illustrated in FIG. 10. Excess of the insulating material 62 may be removed and the surface planarized by any suitable planarizing process such as CMP, which may be followed by a post-CMP clean step. This CMP processes may also remove a small portion 66 of the dielectric rail portions 51, as shown.

Figure 11:
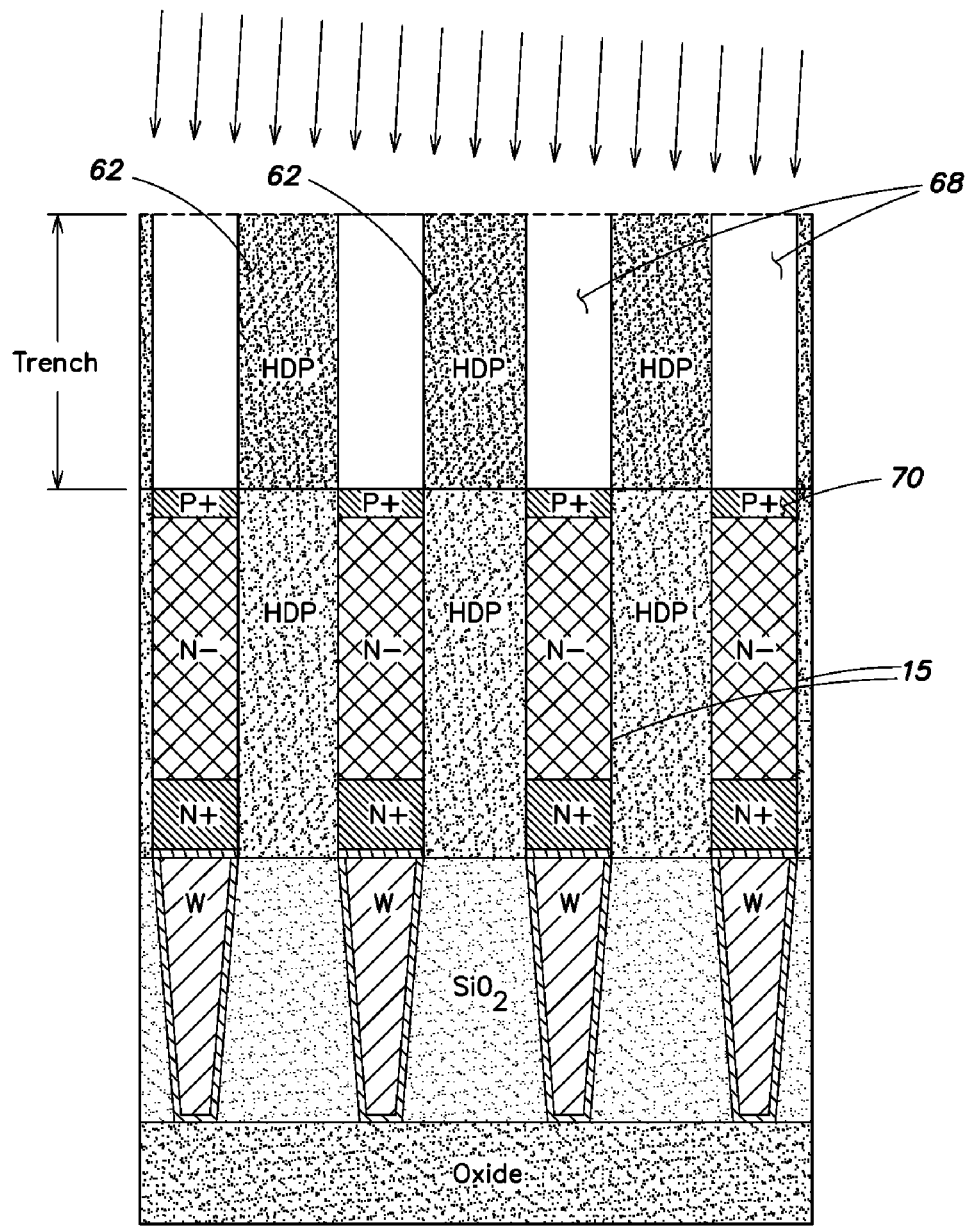
FIG. 11 is a cross-sectional view illustrating one embodiment of the fabrication of conductor trenches and ion implementation for fabrication of the memory array.
Figure 13:
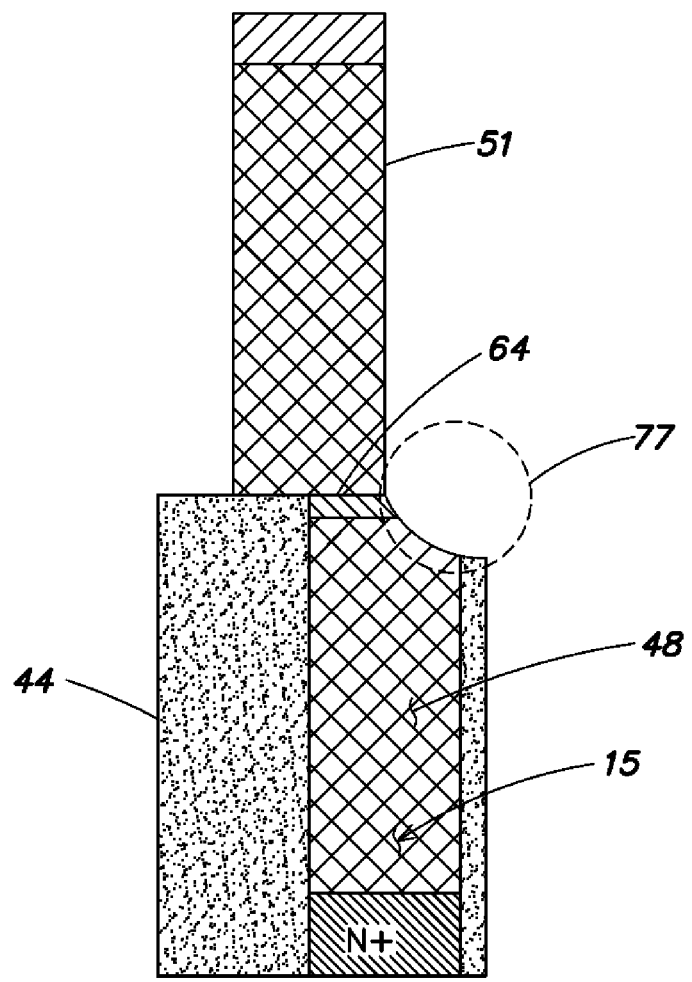
FIG. 13 is a cross-sectional view illustrating an example of misalignment of the rails 51 over the pillar elements 15 of FIG. 9

As illustrated in FIG. 11, the sacrificial rail 51 may be removed to create a mold of dielectric material 62 having trenches or slots 68 for forming conductors positioned over the lightly doped semiconductor pillars. In one embodiment using silicon nitride for the dielectric pillar portion 51 as illustrated in FIG. 10, this removal step may use an initial HF etch, followed by a wet etch of the silicon nitride leaving trenches aligned over the pillar memory elements 14. A significant advantage of this method of forming the conductor mold over the pillar elements 14 is to reduce sensitivity to a misalignment. For example, in the illustrated embodiment of FIGS. 9 and 10 using silicon nitride for the sacrificial material, when the silicon nitride is etched, some misalignment 77, as shown in FIG. 13, of the mask will occur between the position of the rails 51 and the pillar memory elements 15. However, because the wet etch of the silicon nitride is highly selective over silicon dioxide, the native oxide 64 protects the underlying semiconductor material 48 of the pillar memory elements 15. Further, due to the unique process, even if the nitride etch cuts into the semiconductor material 48 of the pillar memory elements 15 in the misalignment region 77, the subsequent oxide filling step will fill the damaged area. Thus, alignment sensitivity is dramatically reduced allowing smaller feature size and higher yield.

The dielectric etch may be followed by an ion implantation process to create a highly doped region 70 at the top of the memory pillar elements 14, as shown. The ion implantation may be performed using any suitable ion implantation technology. In one embodiment, the ion implantation may use the known technique of rotating the ion beam at an angle off of vertical as illustrated in FIG. 11. For example, in the illustrated embodiment a p-type region 70 may be created by implanting boron ions (e.g. using $BF_2$, $B_{11}$, etc.) to form a peak concentration at a depth of about 500 angstroms, and using a rotating angle of about 7° off of vertical. In another embodiment, the ion beam may be at a 0° angle (i.e. vertical). After the implantation step, the surface of the implanted region may then be cleaned with an HF dip which may remove any native oxide(e.g. HF at 100:1 for 30 secs.).

The memory pillar elements 15 each form a diode and may also include an antifuse. In the illustrated embodiment, the pillar element is formed with highly-doped N+ type region 34 on the bottom and a highly doped P+ type region 70 on the top. Other embodiments may use various combinations of N+, N−, P+ and P− regions such as P+ for the bottom 34 and N+ top region 70. In addition, an anti-fuse may also be formed as part of the pillar memory element 15. Thus, in the illustrated embodiment of FIG. 12, after the ion implantation and HF dip, an antifuse 72 may be grown using any suitable oxide formation process, for example, by oxidizing the underlying silicon in $O_2$ plus $N_2$ at a temperature of 650° C. for about 60 seconds. Thickness of this oxide may range from about 10 to about 100 angstroms, and in one embodiment may be about 17 to 22 angstroms.

Figure 12:
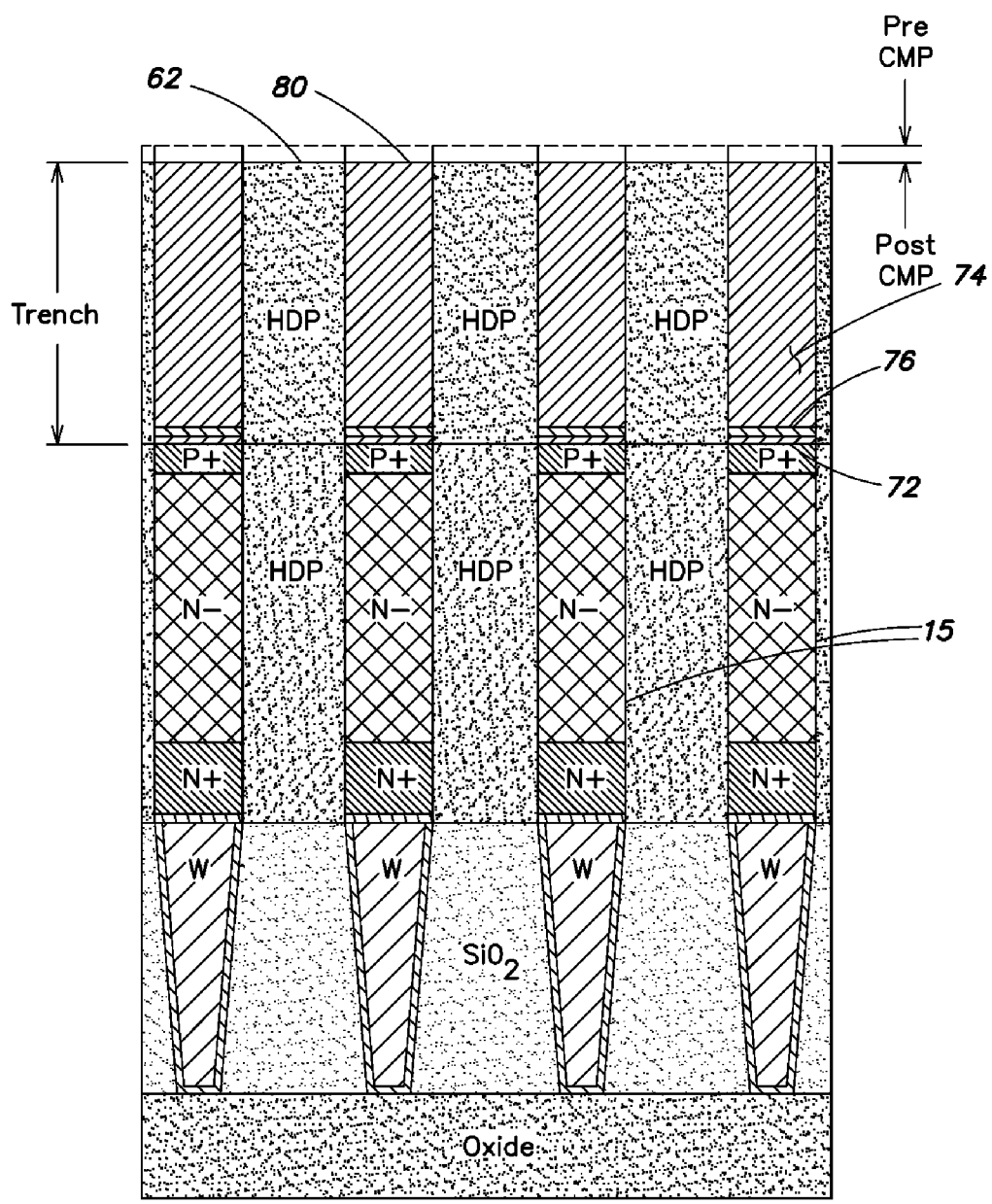
FIG. 12 is a cross-sectional view illustrating one embodiment of the formation of conductor lines for the memory array.

After the antifuse is formed, the trenches 68 may be filled with a conductive material to form conductors 74 by depositing the conductive material as illustrated in FIG. 12. To improve adhesion of the conductor to the antifuse layer 72 and to the HDP oxide layer 62, an adhesion layer 76 may first be deposited in the trenches 68. The adhesion layer 76 may be any suitable adhesion material such as TaN, WN, TiW, TiN, etc. In one embodiment, the conductor material of the conductor 74 may be tungsten with a thickness of about 2000-4000 angstroms and the adhesion layer may be TiN with a thickness of about 50-200 angstroms. After the conductive material has been deposited, the excess is removed and the surface planarized using any suitable planarizing process such as CMP. The planarizing process may remove a portion of the top of the conductor 74 and dielectric 62 while providing a planar surface 80 for further processing.

The resulting structure of FIG. 12 (also FIG. 1) is the memory array 10 made up of a plurality of memory elements 14 and conductors 12 and 16. Additional levels of the memory array of the same structure may be formed on the planarized surface 80 using the above described method.

The invention is not limited to the particular details of the example of method depicted, and other modification and applications are contemplated. Certain other changes may be made in the above-identified method without departing from the true spirit and scope of the invention herein involved. For example, although the invention is depicted with reference to non-volatile memory, the method and apparatus of the present invention can be utilized with a variety of memory systems. It is intended, therefore that the subject matter in the above description shall be interpreted as illustrative.

What is claimed is:

1. A method of forming a structure for a memory cell, the method comprising:
    a) forming a first pillar shaped element, wherein the first pillar-shaped element comprises heavily doped semiconductor material;
    b) forming a mold, the mold comprising a first type of insulating material and having an opening self-aligned with the first pillar-shaped element; and
    c) depositing a second semiconductor material over the mold and in the opening to form a second pillar-shaped element disposed on and aligned with the first pillar-shaped element, wherein the second pillar-shaped element comprises undoped or lightly doped semiconductor material within the opening.

2. The method of forming a structure for a memory cell according to claim 1 wherein the step of forming the first pillar shaped element comprises depositing a semiconductor layer over a conductor and depositing a layer of a second type of dielectric over the semiconductor layer, and patterning and etching the semiconductor layer and the layer of the second type of dielectric to form the first pillar shaped element capped with a pillar-shaped dielectric layer.

3. The method of forming a structure for a memory cell according to claim 2 wherein the step of forming a mold comprises depositing the first type of dielectric so as to fill space surrounding the first pillar shaped element and removing the second dielectric material to form the mold.

4. The method of forming a structure for a memory cell according to claim 2 wherein the heavily doped semiconductor material is N-type, and the second type of dielectric is $Si_3N_4$.

5. The method of forming a structure for a memory cell according to claim 2 wherein the heavily doped semiconductor is N-type and further comprising the step of doping at least a portion of the second pillar shaped element to form a heavily doped P-type region.

6. The method of forming a structure for a memory cell according to claim 2 wherein the heavily doped semiconductor is P-type and further comprising the step of doping at least a portion of the second pillar shaped element to form a heavily doped N-type region.

7. The method of forming a structure for a memory cell according to claim 1 wherein the step of forming the first pillar shaped element comprises forming a pillar having a portion made up of sacrificial material over a portion made up of the first pillar shaped element of heavily doped semiconductor material, and the step of forming a mold comprises filling space surrounding the pillar with the first insulating material and removing the sacrificial material to form the mold with an opening aligned with the pillar portion.

8. The method of forming a structure for a memory cell according to claim 7 further comprising forming a dielectric mold having a trench substantially aligned over the second pillar shaped elements and doping a portion of the second semiconductor material to form a region of a second heavily doped semiconductor.

9. The method of forming a structure for a memory cell according to claim 8 wherein forming the dielectric mold further comprises forming a native oxide over the second semiconductor pillar shaped element, depositing a dielectric layer over the second semiconductor pillar shaped element and the first insulating material, etching the dielectric layer to form rails of dielectric material aligned over the second pillar shaped element with space on each side thereof, filling the space with dielectric material, and removing the lines of dielectric material to form the trench substantially aligned over the second pillar shaped element.

10. The method of forming a structure for a memory cell according to claim 7 further comprising filling the trench with conductive material to form a conductor.

11. A method of forming a memory cell comprising:
a) forming a pillar-shaped semiconductor element comprising a first semiconductor layer and a second semiconductor layer on and aligned with the first semiconductor layer, wherein the first semiconductor layer comprises heavily doped semiconductor material, and wherein the second semiconductor layer comprises undoped or lightly doped semiconductor material;
b) forming a mold of a first insulating material having a patterned trench opening substantially aligned with the pillar-shaped semiconductor element, wherein the second semiconductor layer is deposited within the patterned trench opening;
c) doping a portion of the second semiconductor layer to form a third semiconductor layer;
d) filling the patterned trench opening with conductive material.

12. The method of forming a memory cell according to claim 11 wherein the step of forming a mold comprises forming a layer of a dielectric above the second semiconductor layer, patterning and etching the dielectric to form a rail of the dielectric aligned with the pillar-shaped semiconductor element, filling space around the dielectric rail with the first insulating material, and removing the dielectric rail to form the trench.

13. The method of forming a memory cell according to claim 11 wherein the first semiconductor layer is N-type semiconductor and the insulating material is $SiO_2$.

14. The method of forming a memory cell according to claim 11 further comprising forming an anti-fuse layer disposed on the third semiconductor layer.

15. The method of forming a memory cell according to claim 12 further comprising planarizing, after filling the space around the dielectric rail to expose the rail.

16. The method of forming a memory cell according to claim 14 further comprising forming a barrier layer over the anti-fuse layer before filling the trench.

17. A method of forming an array of memory cells, the method comprising:
a) forming a first plurality of pillar-shaped elements, wherein the first plurality of pillar-shaped elements comprises heavily doped semiconductor material;
b) forming a mold of an insulating material having a plurality of openings, each opening self-aligned with a respective one of the first plurality of pillar-shaped elements; and
c) depositing a second semiconductor material over the mold and in the openings to form a respective second pillar-shaped element disposed on and aligned with each respective one of the first plurality of pillar-shaped elements, wherein each second pillar-shaped element comprises undoped or lightly doped semiconductor material.

18. The method of forming an array of memory cells according to claim 17 wherein the step of forming the first plurality of pillar shaped elements comprises depositing a semiconductor layer over a conductor and depositing a layer of a dielectric over the semiconductor layer; and
patterning and etching the semiconductor layer and the layer of the dielectric to form the first plurality of pillar shaped elements capped with a pillar shaped dielectric layer.

19. The method of forming an array of memory cells according to claim 18 wherein the step of forming the mold comprises depositing the insulating material so as to fill space surrounding the first plurality of pillar shaped elements and removing the dielectric material to form the mold.

20. The method of forming an array of memory cells according to claim 18 wherein the heavily doped semiconductor material is N-type, and the dielectric is silicon nitride.

21. The method of forming an array of memory cells according to claim 18 wherein the heavily doped semiconductor is N-type and further comprising the step of doping at least a portion of the second pillar shaped elements to form heavily doped P-type regions.

22. The method of forming an array of memory cells according to claim 18 wherein the heavily doped semiconductor is P-type and further comprising the step of doping at least a portion of the second pillar shaped elements to form heavily doped N-type regions.

23. The method of forming an array of memory cells according to claim 17 where the step of forming the first plurality of pillar shaped elements comprises forming a plurality of a pillars each having a portion made up of sacrificial material over a portion made up of the first pillar shaped element of heavily doped semiconductor material, and the step of forming a mold comprises filling space surrounding the pillars with the insulating material and removing the sacrificial material to form the mold with openings aligned with the pillar portions.

24. The method of forming an array of memory cells according to claim 23 further comprising forming a mold having trenches substantially aligned over the second pillar shaped elements and doping a portion of the second semiconductor material to form highly doped regions.

25. The method of forming an array of memory cells according to claim 24 wherein forming the mold further comprises forming a native oxide over the second semiconductor pillar shaped elements, depositing a dielectric layer over the second semiconductor pillar shaped elements, the native oxide, and the first insulating material, etching the dielectric layer to form rails of dielectric material aligned over the second pillar shaped elements with space on each side, filling the spaces with insulating material, and removing the lines of dielectric material to form the trenches substantially aligned over the second pillar shaped element.

26. The method of forming an array of memory cells according to claim 13 further comprising filling the patterned trench opening with conductive material to form a conductor.

* * * * *